United States Patent
Huang et al.

(10) Patent No.: US 10,643,686 B2
(45) Date of Patent: *May 5, 2020

(54) MEMORY DEVICE WITH AN ARRAY TIMER MECHANISM

(71) Applicant: Micron Technology, Inc., Boise, ID (US)

(72) Inventors: Zhi Qi Huang, Shanghai (CN); Wei Lu Chu, Shanghai (CN); Hiromasa Noda, Tokyo (JP); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/446,830

(22) Filed: Jun. 20, 2019

(65) Prior Publication Data

US 2019/0304533 A1    Oct. 3, 2019

Related U.S. Application Data

(63) Continuation of application No. 15/923,235, filed on Mar. 16, 2018, now Pat. No. 10,373,670.

(51) Int. Cl.
| | |
|---|---|
| *G11C 5/14* | (2006.01) |
| *G11C 11/4076* | (2006.01) |
| *G11C 11/4072* | (2006.01) |
| *G11C 11/4074* | (2006.01) |
| *G11C 7/22* | (2006.01) |
| *G11C 11/406* | (2006.01) |

(52) U.S. Cl.
CPC .......... *G11C 11/4076* (2013.01); *G11C 5/147* (2013.01); *G11C 7/22* (2013.01); *G11C 11/4072* (2013.01); *G11C 11/4074* (2013.01); *G11C 11/40611* (2013.01); *G11C 11/40615* (2013.01)

(58) Field of Classification Search
CPC ............ G11C 11/4076; G11C 11/4072; G11C 11/4074
See application file for complete search history.

(56) References Cited

U.S. PATENT DOCUMENTS

| | | |
|---|---|---|
| 5,955,905 A | 9/1999 | Idei et al. |
| 8,756,395 B2 | 6/2014 | Barth et al. |
| 10,373,670 B1 * | 8/2019 | Huang |
| 2014/0225583 A1 | 8/2014 | Huang |

(Continued)

OTHER PUBLICATIONS

Lee, Donghyuk, et al., "Tiered-Latency DRAM: A Low Latency and Low Cost DRAM Architecture", Lee, D. et al., "Tiered-Latency DRAM: A Low Latency and Low Cost DRAM Architecture", 2013 IEEE 19th International Symposium on High Performance Computer Architecture (HPCA2013), Feb. 23-27, 2013, Shenzhen, pp. 1-12. DOI: 10.1109/HPCA.2013.6522354.

(Continued)

*Primary Examiner* — Toan K Le
(74) *Attorney, Agent, or Firm* — Perkins Coie LLP

(57) ABSTRACT

A memory device includes a memory array including a plurality of memory cells; and an array timer coupled to the memory array, configured to generate an output timing signal based on a fixed input and a reference signal, wherein: the fixed input is from a supply circuit, the reference signal is from a reference block, and the output timing signal is configured to control the memory array.

23 Claims, 7 Drawing Sheets

(56) References Cited

U.S. PATENT DOCUMENTS

2017/0331488 A1 11/2017 Lee et al.
2019/0074052 A1 3/2019 Mathew et al.

OTHER PUBLICATIONS

Naji, Omar, et al., "A High-Level DRAM Timing, Power and Area Exploration Tool", Naji, O. et al., "A High-Level DRAM Timing, Power and Area Exploration Tool", 2015 International Conference on Embedded Computer Systems: Architectures, Modeling, and Simulation (SAMOS), Samos, 2015, pp. 149-156. DOI: 10.1109/SAMOS.2015.7363670.

* cited by examiner

MEMORY DEVICE WITH AN ARRAY TIMER MECHANISM

CROSS-REFERENCE TO RELATED APPLICATIONS

This application is a continuation of U.S. application Ser. No. 15/923,235, filed Mar. 16, 2018, which is incorporated herein by reference in its entirety.

TECHNICAL FIELD

The disclosed embodiments relate to memory devices, and, in particular, to memory devices with an array timer mechanism.

BACKGROUND

Memory systems can employ memory devices to store and access information. The memory devices can include volatile memory devices, non-volatile memory devices, or a combination device. Memory devices, such as dynamic random access memory (DRAM), can utilize electrical energy to store and access data.

Due to circuit-component specifications, circuit design, etc., some performance or characteristics of the memory devices can vary greatly according to environmental and/or conditional factors. For example, specific performance or characteristics can have wide variations across process voltage temperature (PVT). The PVT variation can correspond to variations in executed process, utilized voltage levels, device temperature, etc.

In some memory devices (e.g., DRAM), the PVT variation can affect signals generated using resistor-capacitor (RC) circuits. For example, certain RC-based timing signals can vary across PVT, which may lead to undesirable results/limitations for the memory devices.

Thus, there is a need for a memory device with a mechanism for maintaining steady signals across different PVT conditions. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to memory devices, systems with memory devices, and related methods for dynamically managing initiation of data streams. The memory devices (e.g., DRAM devices) can include an array timer that provides timing signals for a memory array. For example, the array timer can utilize V-I stable input from a bandgap supply circuit, an analog reference signal from an analog reference block, or a combination thereof to generate an output timing signal (ATOscOut). The output timing signal can be used to provide a refresh activation time (tRAS), a precharge time (tRP), etc. to operate the memory array. Because the array timer uses input from the bandgap supply circuit and/or the analog reference block, the output timing signal can be more robust (e.g., increased stability for the refresh activation time and/or the precharge time) under different PVT condition in comparison to RC delay based timing signals.

The following embodiments are described in sufficient detail to enable those skilled in the art to make and use the embodiments. A person skilled in the relevant art, however, will understand that the technology may have additional embodiments and that the technology may be practiced without several of the details of the embodiments described below with reference to FIGS. 1-6.

In the illustrated embodiments below, the memory devices are described in the context of devices incorporating DRAM-based circuitry. Memory devices configured in accordance with other embodiments of the present technology, however, can include other types of suitable storage media in addition to or in lieu of DRAM-based storage media, such as other volatile or non-volatile storage media (e.g., NAND-based or NOR-based storage media, magnetic storage media, phase-change storage media, ferroelectric storage media, etc.).

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data.

Figure 1:
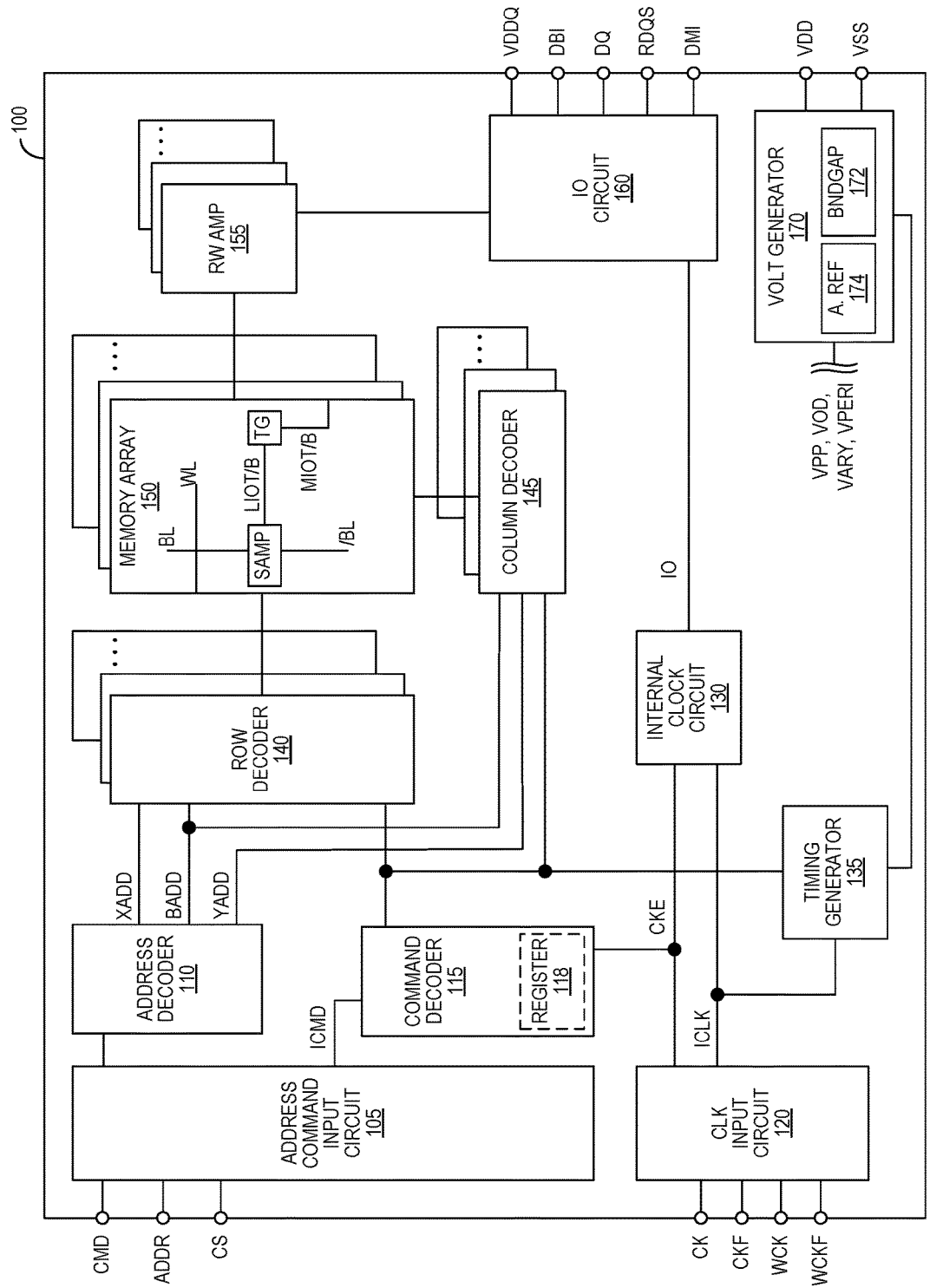
FIG. 1 is a block diagram of a memory device with an array timer mechanism configured in accordance with an embodiment of the present technology.

FIG. 1 is a block diagram of a memory device 100 (e.g., DRAM device) with an array timer mechanism configured in accordance with an embodiment of the present technology. The memory device 100 may include an array of memory cells, such as memory array 150. The memory array 150 may include a plurality of banks, and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation. The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 117 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

In some embodiments, the internal voltage generator circuit 170 include or directly connect to a bandgap supply circuit 172, an analog reference block 174, etc. The bandgap supply circuit 172 can include a voltage reference circuit that produces a fixed/constant voltage regardless of environmental conditions (e.g., PVT variations). The analog reference block 174 can include a circuit that produces a reference voltage level, such as a comparator reference voltage.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated. In some embodiments, the timing generator 135 can include an array timer that is connected to voltage generator 170. For example, the timing generator 135 can be directly or indirectly to the bandgap supply circuit 172, the analog reference block 174, etc.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

The memory array 150 may be refreshed or maintained as described herein. A refresh operation, as described herein, may be initiated by a host device or memory controller, for example, and may include accessing one or more rows (e.g., WL) and discharging cells of the accessed row to a corresponding SAMP. While the row is opened (i.e., while the access WL is energized), the SAMP may compare the voltage resulting from the discharged cell to a reference. The SAMP may then write back a logic value (i.e., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization or the like. Other refresh schemes or methods may also be employed.

Figure 2:
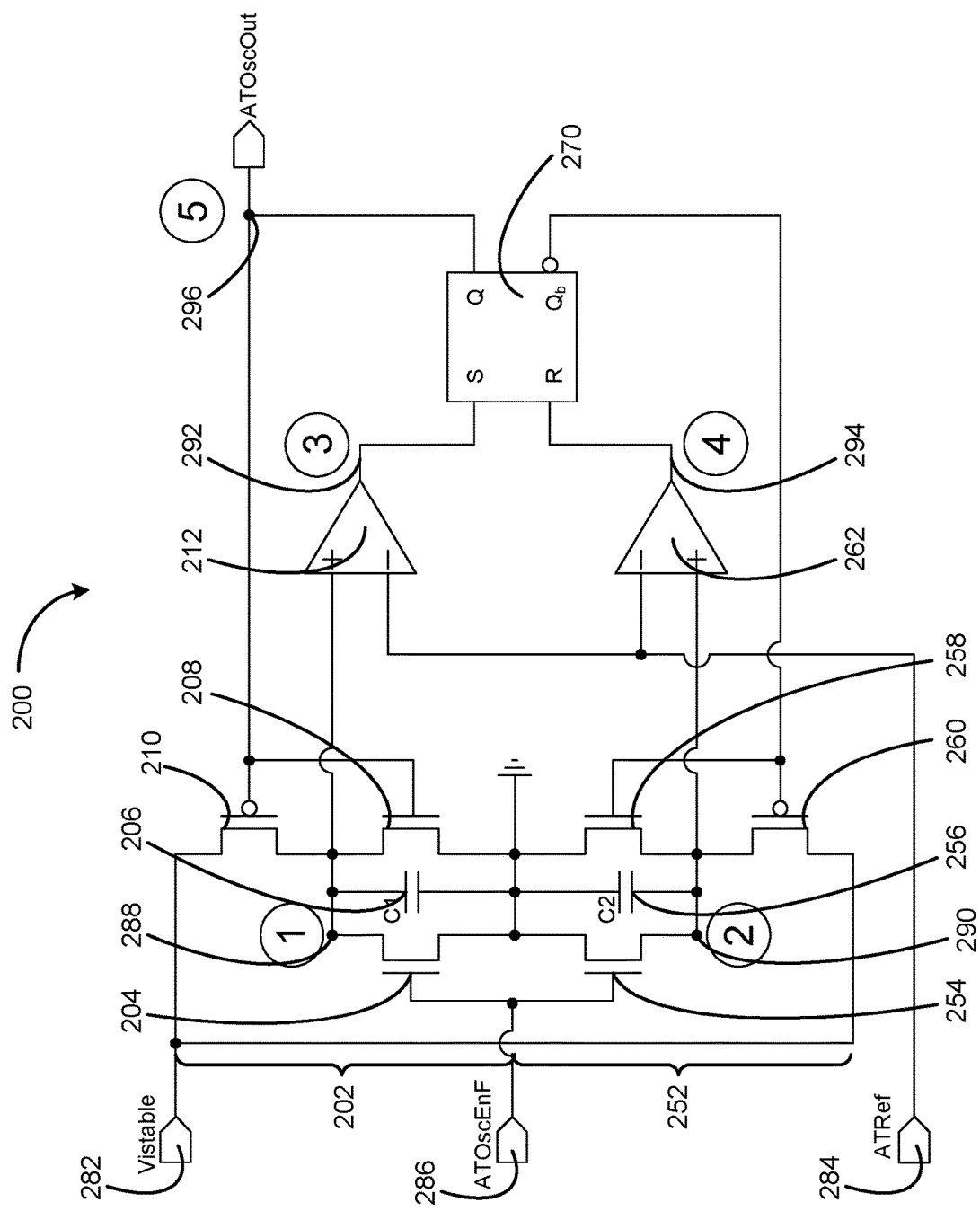
FIG. 2 illustrates an array timer in accordance with an embodiment of the present technology.

FIG. 2 illustrates an array timer 200 (e.g., the timing generator 135 of FIG. 1 or a portion thereof) in accordance with an embodiment of the present technology. The array timer 200 can include circuit configured to generate one or more timing signals for the memory array 150. The array timer 200 can be configured to generate the timing signals that are more stable in time/magnitude across different PVT conditions in comparison to RC-based timing signals.

In some embodiments, the array timer 200 can include a first section 202 and a second section 252. The first section 202 can include circuit components identical to the second section 252. The first section 202 and the second section 252 can be configured to operate complementary of each other, such as for providing timing signals that are offset from each other. For example, the first section 202 can include a first enable switch 204, a first capacitor 206 ("C1"), a first regulator switch 208, a first complementary switch 210, a first comparator 212 (e.g., a high-speed, rail-to-rail comparator), etc. Also, the second section 252 can include a second enable switch 254, a second capacitor 256 ("C2"), a second regulator switch 258, a second complementary switch 260, a second comparator 262 (e.g., a high-speed, rail-to-rail comparator), etc. In some embodiments, the first enable switch 204, the first regulator switch 208, the second enable switch 254, the second regulator switch 258, or a combination thereof can be implemented using NMOS transistors, and the first complementary switch 210 and the second complementary switch 260 can be implemented using PMOS transistors.

For the first section 202, terminals (e.g., NMOS drain, a capacitor terminal, PMOS drain, etc.) of the first enable switch 204, the first capacitor 206, the first regulator switch 208, and the first complementary switch 210 can be directly tied together to form a first node ("1"). The first node can directly connect to a positive input of the first comparator 212. For the second section 252, terminals (e.g., NMOS drain, a capacitor terminal, PMOS drain, etc.) of the second enable switch 254, the second capacitor 256, the second regulator switch 258, and the second complementary switch 260 can be directly tied together to form a second node ("2"). The second node can directly connect to a positive input of the second comparator 262. The negative inputs of the first comparator 212 and the second comparator 262 can connect to a voltage potential, such as an analog reference signal 284 ("ATRef"), such as 0.7V in some embodiments, from the analog reference block 174 of FIG. 1.

The first section 202 and the second section 252 can further connect to a voltage/current source, to each other, to electrical ground, etc. For example, the PMOS source of the first complementary switch 210 and the second complementary switch 260 can be connected to the bandgap supply circuit 172 of FIG. 1. As a result, the array timer 200 can utilize a V-I stable input 282 ("Vistable") for input current that is more stable/constant across various PVT conditions in comparison to the RC-based signals. Also for example, terminals (e.g., NMOS source) of the first enable switch 204 and the second enable switch 254, terminals of the first capacitor 206 and the second capacitor 256, terminals (e.g., NMOS source) of the first regulator switch 208 and the second regulator switch 258, etc. can be directly connected together to form a node (e.g., grounded node). In some embodiments, the node can be connected to a voltage potential (e.g., electrical ground) different than the analog reference signal.

The array timer 200 can operate based on an enable signal (e.g., an enable inverse signal 286 ("ATOscEnF")). The enable signal can be connected to gates of the first enable switch 204 and the second enable switch 254 and operate the switches accordingly. For example, the enable signals can turn the switches off and charge the capacitors (e.g., the first capacitor 206, the second capacitor 256, etc.). The voltages at the first node (e.g., a first comparator input 288) and the second node (e.g., a second comparator input 290) can increase accordingly. When the switches are turned on, the first node and the second node can be essentially connected to the electrical ground.

The voltage at the first node (e.g., the first comparator input 288) can operate the first comparator 212, and the voltage at the second node (e.g., the second comparator input 290) can operate the second comparator 262. The first comparator 212 can compare the first comparator input 288 to the analog reference signal 284 to generate a first comparator output 292 ("3"). The second comparator 262 can compare the second comparator input 290 to the analog reference signal 284 to generate a second comparator output 294 ("4").

The array timer 200 can further include a reset-set (RS) memory element 270 directly connected to outputs of the first comparator 212 and the second comparator 262. For example, the first comparator 212 can be connected to a set input ("S") of the RS memory element 270 and the second comparator 262 can be connected to a reset input ("R"). Accordingly, the first comparator output 292 can control the set input and the second comparator output 294 can control the reset input. Outputs of the RS memory element 270 can be directly connected to the first regulator switch 208, the first complementary switch 210, the second regulator switch 258, the second complementary switch 260, etc. For example, a latch current state ("Q") can be connected to gates of the first regulator switch 208 and the first complementary switch 210. The latch current state can also be an output timing signal 296 ("5") that is used to control the memory array 150. Also, a latch current inverse ("$Q_b$") or an inverted version thereof can be connected gates of the second regulator switch 258 and the second complementary switch 260.

Figure 3:
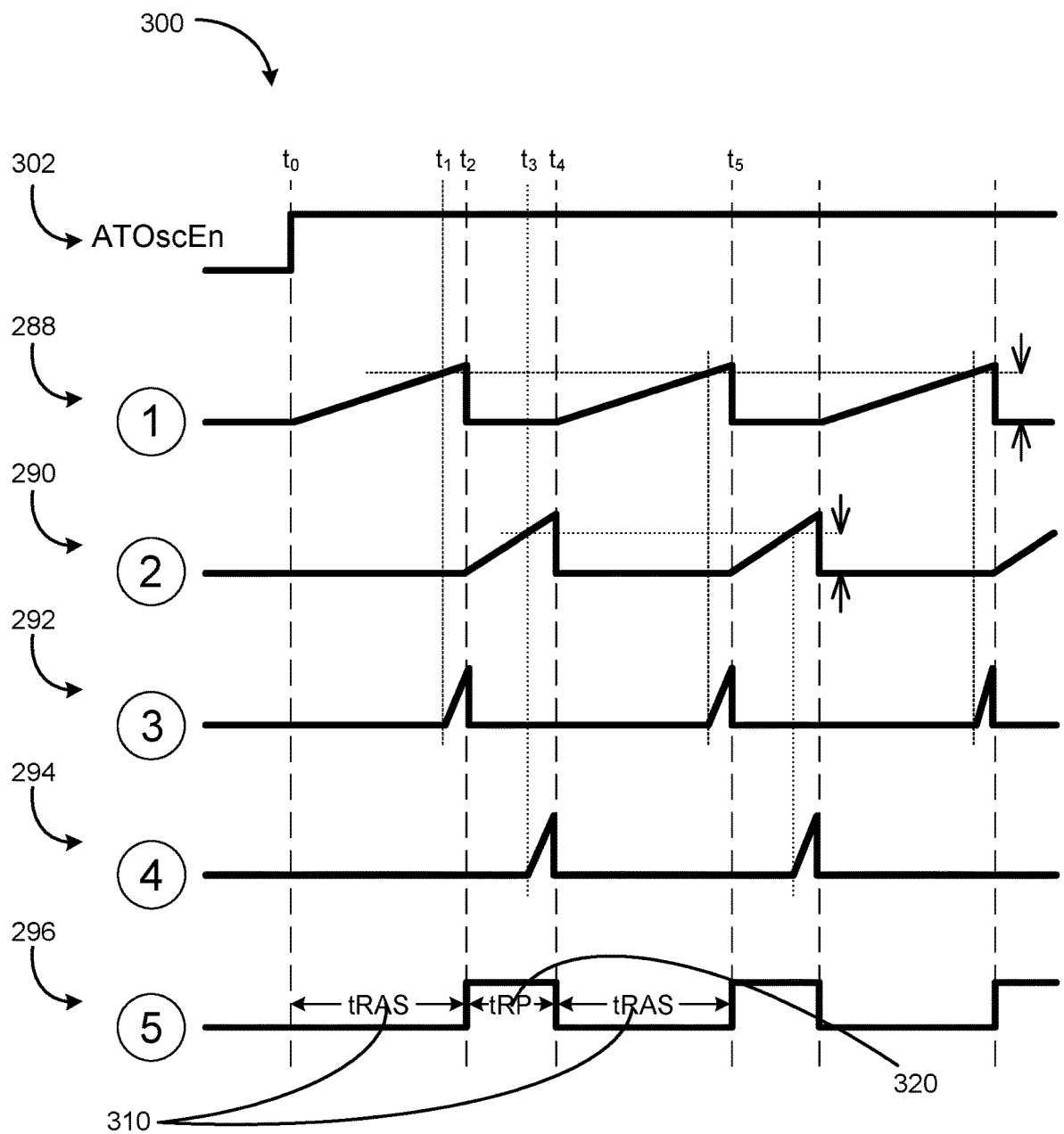
FIG. 3 illustrates a timing diagram in accordance with an embodiment of the present technology.

FIG. 3 illustrates a timing diagram 300 in accordance with an embodiment of the present technology. The timing diagram 300 can describe an operating sequence of the array timer 200 of FIG. 2. For example, the timing diagram 300 can illustrate voltage levels for various nodes/signals of the array timer 200, such as the first comparator input 288, the second comparator input 290, the first comparator output 292, the second comparator output 294, the output timing signal 296, etc., all of FIG. 2.

An enable signal 302 ("ATOscEn") can control the operating sequence of the array timer 200. The enable signal 302 can be a signal that is inverse or complementary of the enable inverse signal 286 of FIG. 2. When the enable signal 302 goes high (e.g., at to), and the enable inverse signal 286 goes low, the array timer 200 can begin the operating sequence. In response to the enable signal 302 going high and with the output timing signal 296 low, the first section 202 of FIG. 2 can become active while the second section 252 of FIG. 2 remains off. For example, the first section 202 can become active with the first enable switch 204 of FIG. 2 turning off, the first complementary switch 210 of FIG. 2 turning on, the first regulator switch 208 of FIG. 2 remaining off, etc. Accordingly, the first capacitor 206 of FIG. 2 can be charged using the V-I stable input 282 of FIG. 2 and the first comparator input 288 can increase/rise.

Once the first comparator input 288 reaches a certain level (e.g., same as that of the analog reference signal 284 of FIG. 1), such as at $t_1$, the first comparator 212 can flip and generate an output, and the first comparator output 292 can begin to increase/rise. Similarly, when the first comparator output 292 reaches a threshold level, such as at $t_2$, the RS memory element 270 of FIG. 2 can respond and change an output state. Accordingly, the output timing signal 296 can go high. Based on the output timing signal 296 going high, the second section 252 can become active and the first section 202 can turn off. For example, the first section 202 can turn off with the first complementary switch 210 turning off, the first regulator switch 208 turning on, etc. Accordingly, the first capacitor 206 can be discharged and the first comparator input 288 can reset to low. Also, the second section 252 can turn on with the second enable switch 254 remaining on (e.g., such as from to), along with the second complementary switch 260 of FIG. 2 turning on, the second regulator switch 258 of FIG. 2 remaining off, etc. Accordingly, the second capacitor 256 of FIG. 2 can be charged using the V-I stable input 282 and the second comparator input 290 can increase/rise.

Similar to the operation of the first section 202, the second comparator 262 can begin generating an output when the second comparator input 290 reaches a certain level (e.g., same as that of the analog reference signal 284), such as at $t_3$. Accordingly, the second comparator output 294 can begin to increase/rise. When the second comparator output 294 reaches a threshold level, such as at $t_4$, the RS memory element 270 can respond and change the output state. In response, the output timing signal 296 can go low. Based on the output timing signal 296 going low, the second section 252 can become inactive and the first section 202 can become active. For example, the second capacitor 256 can discharge and the first capacitor 206 can begin charging. The above discussed process can repeat while the enable signal 302 remains on/high.

Based on the above described operation, the array timer 200 can generate the output timing signal 296 according to a refresh activation time 310 ("tRAS"), a precharge time 320 ("tRP"), etc. The refresh activation time 310 can represent time needed to activate one or more subarrays, such as for row access strobe. The refresh activation time 310 can be a duration between a rising edge of the enable signal 302 (e.g., at to) and a rising edge of the output timing signal 296 (e.g., at $t_2$), between rising edges of the output timing signal 296 (e.g., between $t_4$ and $t_5$), etc. The precharge time 320 can represent time associated with a precharging phase. The precharge time 320 can be pulse width (i.e., a duration between a rising edge, such as at $t_2$, and a subsequent falling edge, such as at $t_4$) of the output timing signal 296.

In some embodiments, the array timer 200 can include the first capacitor 206 and the second capacitor 256 having capacitance levels that are configured to control the timing durations. For example, the capacitance level of the first capacitor 206 can correspond to the refresh activation time 310, such as a charging time for the first capacitor 206 given a voltage/current input level. Also for example, the capacitance level of the second capacitor 256 can correspond to the precharge time 320, such as a charging time for the second capacitor 256 given a voltage/current input level.

Figure 4:
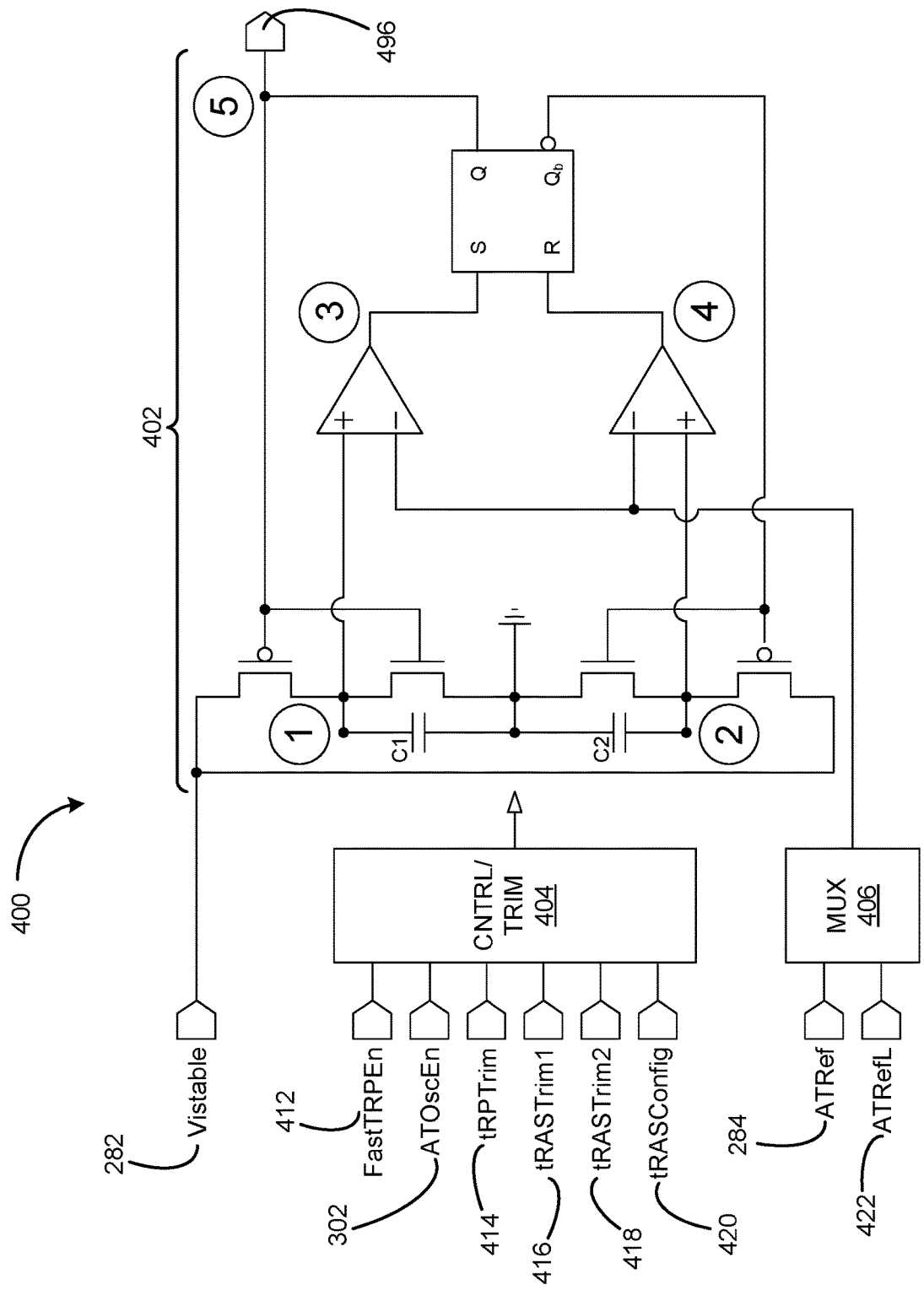
FIG. 4 illustrates an adjustable array timer in accordance with an embodiment of the present technology.

FIG. 4 illustrates an adjustable array timer 400 in accordance with an embodiment of the present technology. The adjustable array timer 400 can be similar to the array timer 200 of FIG. 2, but further offer different values/durations for an output timing signal 496 or portions therein. For example, the adjustable array timer 400 can vary pulse widths of a positive pulse (e.g., the precharge time 320 of FIG. 3) and/or a negative pulse (e.g., the refresh activation time 310 of FIG. 3) of the output timing signal 496.

The adjustable array timer 400 can include a timer circuit 402 configured to generate an output timing signal 496 according to one of multiple different trim settings. The timer circuit 402 can be similar to the array timer 200. For example, the timer circuit 402 can include capacitors, regulator switches, the complementary switches, comparators, the RS memory element, etc. Also, voltages at various nodes (e.g., nodes 1-5) of the timer circuit 402 can behave similarly as illustrated in FIG. 3.

The timer circuit 402 can be without the enable switches. Instead of the enable switches, the adjustable array timer 400 can control the timer circuit 402 using a control-trim module 404, a multiplexer 406, etc. The control-trim module 404 can include circuit/logic configured to control duration(s) for the output timing signal 496 or portions therein, similar to the enable switches of the array timer 200. The control-trim module 404 can control the duration(s) based on a fast TRP enable signal 412 ("FastRPEn"), a tRP trim signal 414 ("tRPTrim"), a first tRAS trim 416 ("tRASTrim1"), a second tRAS trim 418 ("tRASTrim2"), a tRAS configuration signal 420 ("tRASConfig"), etc. in addition to the enable signal 302. The enable signal 302 can include an array time enable signal from the array controller. The fast TRP enable signal 412 can include a fast tRP enable signal also from the array controller. The tRP trim signal 414 can include a signal for controlling the precharge time 320. The first tRAS trim 416 and the second tRAS trim 418 can control different durations for the refresh activation time 310. The tRAS configuration signal 420 can include a configuration signal for the default refresh activation time 310. The input signals for the control-trim module 404 can be digital signals. The tRP trim signal 414, the first tRAS trim 416, the second tRAS trim 418, etc. can be for fuse-backed test modes to trim a high time and a low time of an array timer oscillator. The test modes can be for measuring the positive pulse (e.g., the precharge time 320) and/or the negative pulse (e.g., the refresh activation time 310) of the output timing signal 496. Array timer oscillator low time can be a reference for internal tRAS time, and high time can be a reference for internal tRP time. By trimming the high time and low time of array timer oscillator, the array timer 400 can adjust internal tRAS and tRP accordingly.

The adjustable array timer 400 (e.g., the control-trim module 404) can utilize two groups of 4-bit trim bits for the refresh activation time 310 and the precharge time 320 separately. The durations/values for the refresh activation time 310 and the precharge time 320 can correspond to two or more auto-refresh modes. In some embodiments, the adjustable array timer 400 can utilize three or more different durations/values. For example, the refresh activation time 310 can have a duration between 1 ns to 1000 ns (e.g., between 30 ns to 150 ns for some embodiments) for the different auto-refresh modes.

The adjustable array timer 400 can use the multiplexer 406 to route either the analog reference signal 284 or a low reference signal 422 ("ATRefL") to negative/reference inputs of the comparators in the timer circuit 402. The low reference signal 422 can include a reference voltage level (e.g., 0.4V) that is lower voltage than the analog reference signal 284 (e.g., 0.7V). the adjustable array timer 400 can control the multiplexer 406 using the control-trim module 404 according to its input signals.

Figure 5A:
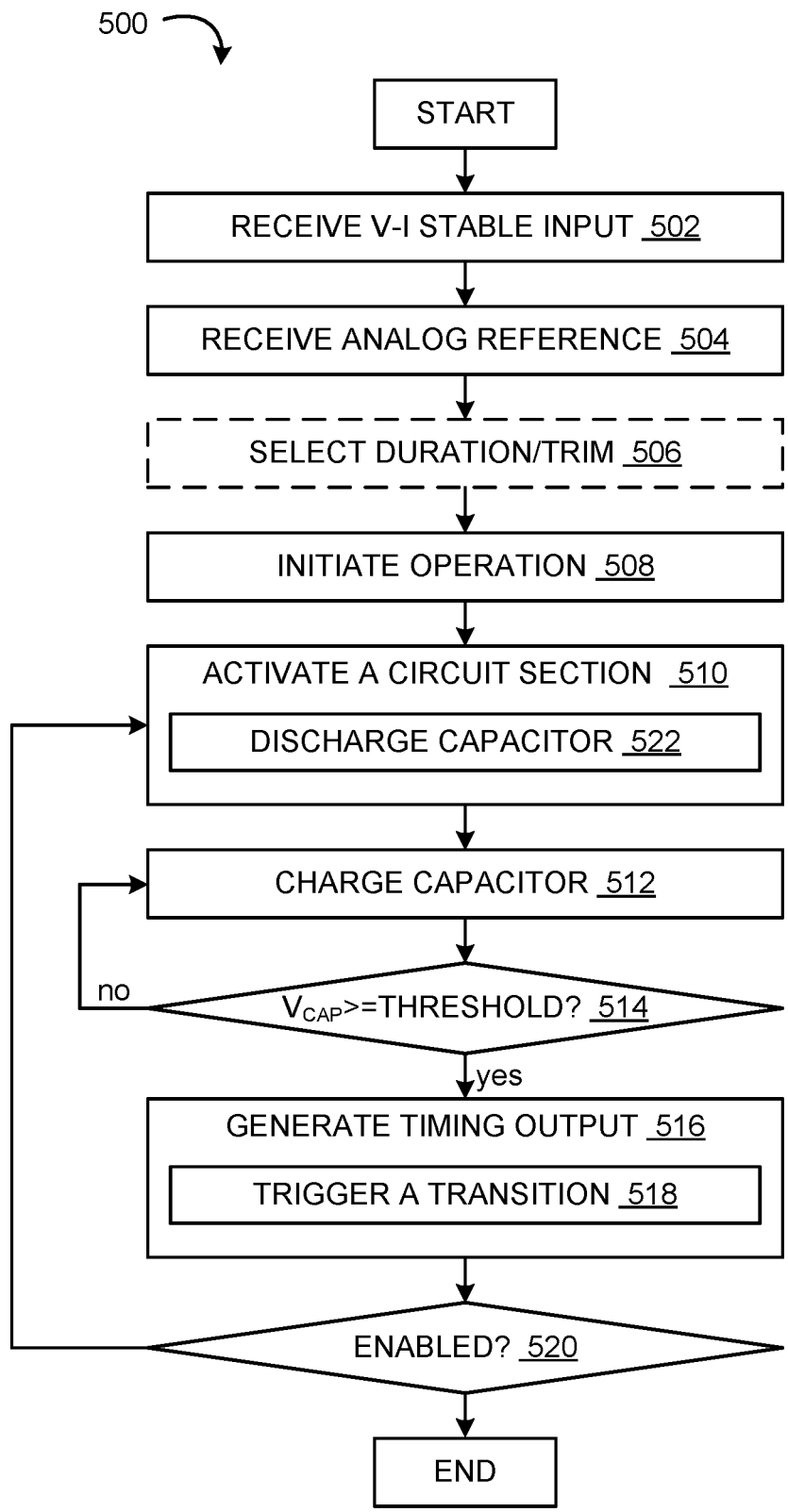
FIG. 5A and FIG. 5B are flow diagrams illustrating example methods of operating the memory device of FIG. 1 in accordance with an embodiment of the present technology.
Figure 5B:
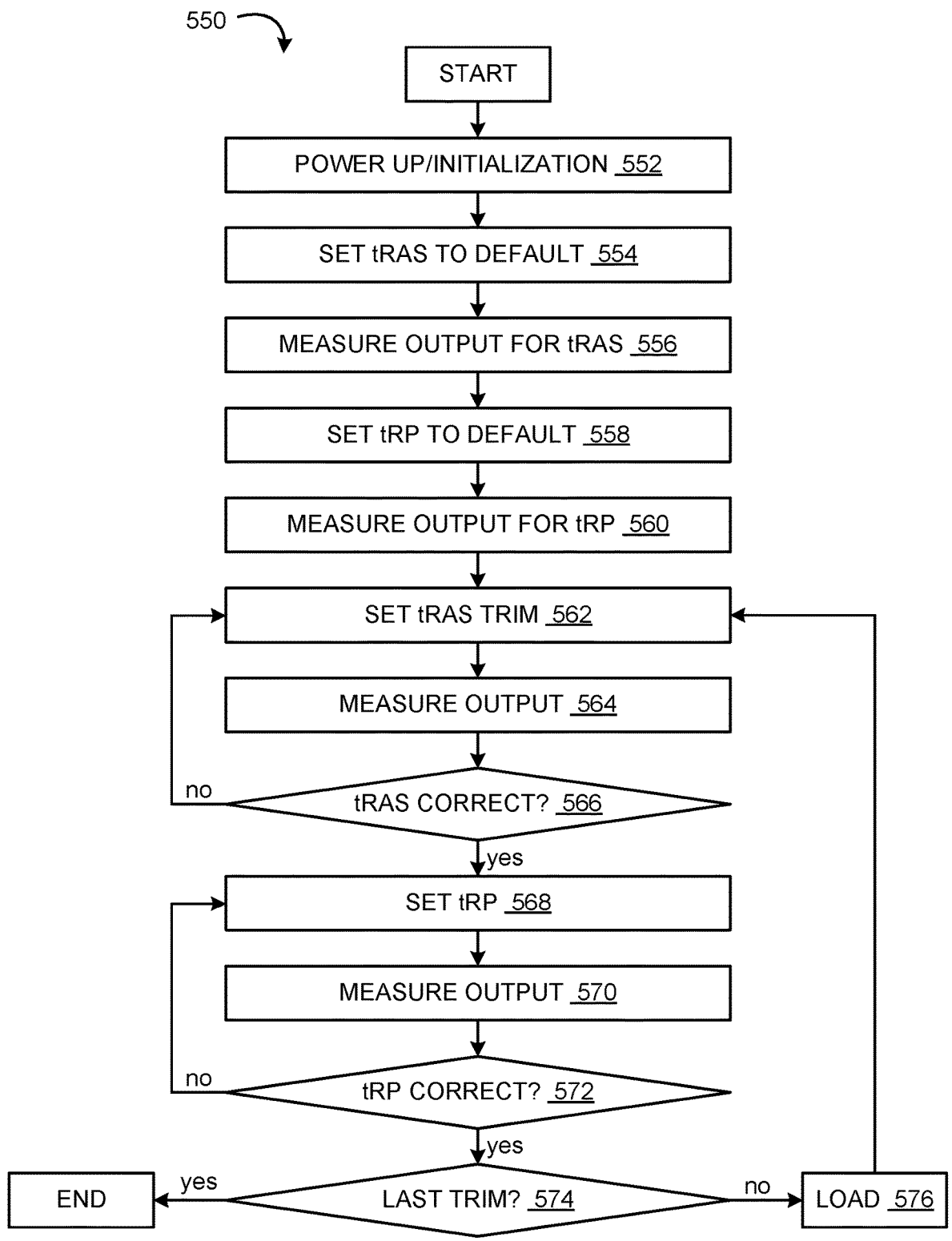

FIG. 5A and FIG. 5B are flow diagrams illustrating example methods of operating the memory device 100 of FIG. 1 in accordance with an embodiment of the present technology. The example methods can be for operating an array timer (e.g., the array timer 200 of FIG. 4 and/or the array timer 400 of FIG. 4). FIG. 5A illustrates an example method 500 for generating an output timing signal (e.g., the output timing signal 296 of FIG. 3 and/or the output timing signal 296 of FIG. 4).

At box 502, the array timer can receive a V-I stable input (e.g., the V-I stable input 282 of FIG. 2) from a voltage source, such as the bandgap supply circuit 172 of FIG. 1. Similarly, at box 504, the array timer can receive an analog reference signal (e.g., the analog reference signal 284 of FIG. 2 and/or the lower reference signal 422 of FIG. 4) from a reference block, such as the analog reference block 174. The analog reference signal can be different from an electrical ground.

In some embodiments, the array timer or a portion therein can select an appropriate signal duration or trim level, such as at box 506. For example, the control-trim module 404 of FIG. 4 can select a duration for the refresh activation time 310 of FIG. 3, the precharge time 320 of FIG. 3, or a combination thereof in the output timing signal. In some embodiments, the refresh activation time 310 can be a duration from an enabling signal or a falling edge (e.g., a high-to-low transition in voltage levels) of the output timing signal to a rising edge (a low-to-high transition in voltages levels) of the output timing signal. Also, the precharge time 320 of FIG. 3 can be a duration from the enabling signal or the rising edge of the output timing signal to the falling edge of the output timing signal.

At box 508, the array timer can initiate operations. The array timer can initiation operations according to levels/changes in a triggering signal (e.g., the enable signal 302 of FIG. 3, the enable inverse signal 286 of FIG. 2, the fast TRP enable 412 of FIG. 4, etc.). The array timer can initiate by activating a circuit section (the timer circuit 402 of FIG. 4, the first section 202 of FIG. 2, the second section 252 of FIG. 2, etc.), such as at box 510. The array timer can activate the circuit section based on setting a group of switches (e.g., the enable switches of FIG. 2, the regulator switches of FIG. 2, the complementary switches of FIG. 2, switches for the multiplexer 406 of FIG. 4, etc.). The array timer can set the group of switches according to the enabling/triggering signal, a previous/current voltage level of the output timing signal, a voltage level transition in the output timing signal, corresponding component settings, etc.

At box 512, the array timer can charge a capacitor (e.g., the first capacitor 206 or the second capacitor 256, both of FIG. 2) in the activated circuit using the V-I stable input. The group of switches can route the V-I stable input to the capacitor in the activated circuit. The array timer can generate a comparator input signal (e.g., the first comparator input 288 or the second comparator input 290, both of FIG. 2) based on charge stored on the capacitor.

At decision box 514, the array timer can determine whether the comparator input signal exceeds a threshold (e.g., the analog reference signal). The comparator input signal can be routed to a comparator (e.g., the first comparator 212 or the second comparator 262, both of FIG. 2). The comparator can further access the analog reference signal and generate a comparator output signal (e.g., the first comparator output 292 or the second comparator output 294, both of FIG. 2) when the comparator input exceeds the threshold. Otherwise, the capacitor can continue to charge using the V-I stable input.

At box 516, the array timer can generate a timing output (e.g., the refresh activation time 310 or the precharge time 320). The array timer can generate the timing output based on using a flip-flop type of component (e.g., the reset-set (RS) memory element 270 of FIG. 2). The array timer can generate the timing output by triggering, such as at box 518, a transition (e.g., a low-to-high transition or a high-to-low transition) in the voltage level of the output timing signal.

At decision box 520, the array timer can determine whether it is enabled to further generate the timing output. If the enable signal is not present, the method 500 can end. While the enable signal is present, the control flow can pass back to box 510. At box 510, the setting for the group of switches can change according to the transition in the output timing signal. As a result, a different circuit section can be selected and the method can continue as discussed above. At box 522, the previous charged capacitor can be discharged according to the updated setting of the group of switches.

The array timer using the V-I stable input and the analog reference signal to generate the output timing signal as described above can provide a timing signal that is more constant across various PVT conditions in comparison to the RC-based timing signals. Normally, RC delay (e.g., tRFC and tRP) PVT variation can be approximately ±35%. The array timer discussed above can generate the output timing signal that varies by ±8% or less. As such, refresh function/aspect may no longer be the limiting factor for Row Activation and Precharge. Also, actual (tRAS) and Precharge (tRP) time in Refresh (e.g., across PVT) can be more relaxed than the SPEC tRAS and tRP (e.g., for Read/Write). Further, the above discussed array timer can make sure that the Refresh operation is completed within tRFC across PVT.

FIG. 5B illustrates an example method 550 for adjusting internal tRAS and tRP of the array timer oscillator, such as for the array timer 400 of FIG. 4. The method 550 can be for fuse-backed test modes to trim a high time and a low time of an array timer oscillator. The test modes can be for measuring the positive pulse (e.g., the precharge time 320 of FIG. 3) and/or the negative pulse (e.g., the refresh activation time 310 of FIG. 3) of the output timing signal 496. Array timer oscillator low time can be a reference for internal tRAS time, and high time can be a reference for internal tRP time.

At box 552, the memory device 100 and/or the array timer therein can be powered up and initialized, such as for a device power up event or a reset event. In some embodiments, the memory device 100 can set a default setting for the auto-refresh mode.

At box 554, the memory device 100 can set tRAS (e.g., the refresh activation time 310) to a default setting. In some embodiments, the memory device 100 (e.g., the clock input circuit 120 of FIG. 1, the command/address input circuit 105 of FIG. 1, etc.) can generate the first tRAS trim 416 of FIG. 4 representing the default setting. In response, the array timer can select the default setting for the timing values based on the first tRAS trim 416. In some embodiments, the array timer can further set the tRP (e.g., the precharge time 320) to a corresponding value based on the default value of the first tRAS trim 416. For example, the default values for the precharge time 320 and the refresh activation time 310 can be equal to each other so that the output duty cycle is 50% and is able to be measured by a tester.

At box 556, the array timer can generate the output timing signal according to the tRAS default setting. The memory device 100 can measure the output timing signal and calculate a period $T_1$. The default value of the first tRAS trim 416 can be verified or updated based on $T_1$.

At box 558, the memory device 100 can set tRP (e.g., the precharge time 320) to a default setting. In some embodiments, the memory device 100 can generate the tRP trim 414 of FIG. 4 representing the default setting. In response, the array timer can select the default setting for the timing values based on the tRP trim 414. In some embodiments, the array timer can maintain the tRAS same as the setting in box 554 while changing the tRP setting to its own default value.

At box 560, the array timer can generate the output timing signal according to the tRP default setting. The memory device 100 can measure the output timing signal and calculate a period $T_2$. The default value of the tRP trim 414 can be verified or updated based on $T_2$.

At box 562, the memory device 100 can set one of the non-default tRAS trims. For example, the memory device 100 can select set/select the trim of the first tRAS trim 416 for the first iteration. The memory device 100 can set/select the trim based on the verified/updated default value of the first tRAS trim 416 and/or a trim table.

At box 564, the array timer can generate the output timing signal according to the selected trim. The memory device 100 can measure the output timing signal and calculate a period $T_3$.

At decision box 566, a testing system (e.g., a device or a set of devices separate from the memory device 100 and configured to test or verify performance/operation of the memory device 100) can verify whether the measured tRAS is correct. The testing system can verify based on calculating the tRAS time by subtracting the measure/updated default tRP time (e.g., based on $T_2$) from the measured period $T_3$ or a processing/normalized result thereof. The testing system can compare the calculated tRAS time to a predetermined target value. When the calculated tRAS time does not match the predetermined target value, the flow can pass to box 562. At box 562, the memory device 100 can use a different value from the trim table to set the tRAS trim.

At box 568, when the calculated tRAS time matches the predetermined target value, the testing system can set the tRP to a value corresponding to the non-default tRAS trim verified at box 566. At box 570, the array timer can generate the output timing signal according to the selected trim. The testing system can measure the output timing signal and calculate a period $T_4$.

At decision box 572, the testing system can verify whether the measured tRP is correct. The testing system can verify based on calculating the tRP time by subtracting the measure/updated default tRP time (e.g., based on $T_3$) from the measured period $T_4$ or a processing/normalized result thereof. The testing system can compare the calculated tRP time to a predetermined target value. When the calculated tRP time does not match the predetermined target value, the flow can pass to box 568. At box 568, the testing system can use a different value from the trim table to set the tRP trim.

At decision box 574, when the calculated tRP time matches the predetermined target value, the testing system can verify whether the tested tRAS trim (e.g., at box 562) is last of the trim values according to a predetermined test sequence. If the tested/adjusted tRAS trim is the last trim in the test sequence, the method 550 can end. If the tested/adjusted tRAS is not the last trim, at decision box 576, the testing system can load the next tRAS trim in according to the test sequence. The flow can pass back to box 562 with the updated tRAS trim and the process can repeat to adjust the tRAS trim values.

By trimming the high time and low time of array timer oscillator, the array timer 400 can adjust internal tRAS and tRP accordingly. Based on the ability to adjust the internal tRAS and tRP, the array timer 400 can maintain accurate timing across PVT conditions and/or wear conditions of the array timer 400. Further, dynamically adjusting the timing can increase a lifetime/durability of the array timer.

Figure 6:
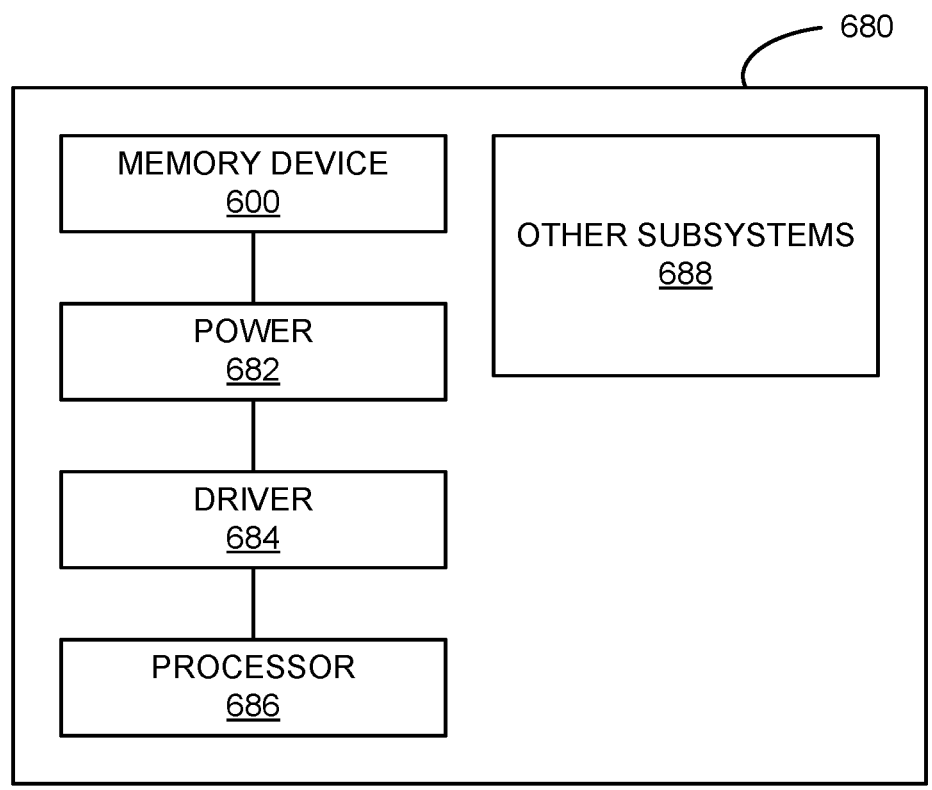
FIG. 6 is a schematic view of a system that includes a memory device in accordance with an embodiment of the present technology.

FIG. 6 is a schematic view of a system that includes a memory device in accordance with embodiments of the present technology. Any one of the foregoing memory devices described above with reference to FIGS. 1-5 can be incorporated into any of a myriad of larger and/or more complex systems, a representative example of which is system 680 shown schematically in FIG. 6. The system 680 can include a memory device 600, a power source 682, a driver 684, a processor 686, and/or other subsystems or components 688. The memory device 600 can include features generally similar to those of the memory device described above with reference to FIGS. 1-5, and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
   a memory array including a plurality of memory cells;
   a reference block coupled to the memory array, the reference block configured to provide a reference signal different from an electrical ground; and
   an array timer coupled to the memory array and the reference block, the array timer configured to generate an output timing signal based on a fixed input and the reference signal, the output timing signal configured to control the memory array.

2. The memory device of claim 1, wherein the output timing signal includes a reference activation time and a precharge time corresponding to voltage level transitions in the output timing signal.

3. The memory device of claim 1, wherein the array timer includes:
   a first section configured to transition the output timing signal from a low voltage level to a high voltage level; and
   a second section configured to transition the output timing signal from the high voltage level to the low voltage level.

4. The memory device of claim 3, further comprising:
   a supply circuit coupled to the memory array, the supply circuit configured to provide a fixed input; and
   wherein:
   the array timer is further coupled to the supply circuit and configured to generate the output timing signal based on the fixed input and the reference signal.

5. The memory device of claim 4, wherein the array timer includes:
   the first section includes a first capacitor configured to charge using the fixed input, wherein the first capacitor triggers a low-to-high transition in the output timing signal; and
   the second section includes a second capacitor configured to charge using the fixed input, wherein the second capacitor triggers a high-to-low transition in the output timing signal.

6. The memory device of claim 5, wherein the array timer includes:
   the first section includes a first comparator directly coupled to the first capacitor, the first comparator configured to generate a first comparator output based on an amount of charge on the first comparator, wherein the first comparator output is for triggering the low-to-high transition; and
   the second section includes a second comparator directly coupled to the second capacitor, the second comparator configured to generate a second comparator output based on an amount of charge on the second comparator, wherein the second comparator output is for triggering the high-to-low transition.

7. The memory device of claim 6, wherein the array timer includes a reset-set memory element directly coupled to the first section and the second section, the reset-set memory element configured to generate the output timing signal based on the low-to-high transition and the high-to-low transition according to the first comparator output and the second comparator output.

8. The memory device of claim 4, wherein the supply circuit is a bandgap supply circuit and the fixed input is a V-I stable input.

9. The memory device of claim 4, wherein the reference block is an analog reference block and the reference signal is an analog reference signal.

10. The memory device of claim 3, wherein the array timer includes a set of transistors configured to alternately activate the first section and the second section according to the voltage level transitions in the output timing signal.

11. The memory device of claim 3, wherein the array timer includes enable transistors configured to initiate the voltage level transitions in the output timing signal.

12. The memory device of claim 1, wherein the array timer includes a control-trim module configured to control a duration for one or more portions of the output timing signal.

13. The memory device of claim 12, wherein the control-trim module is configured to control the duration according to a fast enable signal, an enable signal, a precharge trim signal, a first refresh trim signal, a second refresh trim signal, a refresh configuration signal, or a combination thereof.

14. The memory device of claim 12, wherein the control-trim module is configured to adjust a duration from a rising edge to a falling edge of the output timing signal, a duration from the falling edge to the rising edge, or a combination thereof.

15. The memory device of claim 12, wherein:
the reference block is configured to provide a low reference signal along with the reference signal, wherein the low reference signal is different from the electrical ground; and
the array timer includes a multiplexer configured to select either the reference signal or the low reference signal, wherein the array timer is configured to control the duration based on comparing the selected reference to one or more capacitor voltages.

16. The memory device of claim 1, wherein the memory array is configured to operate based on the output timing signal instead of a resistor-capacitor based timing signal.

17. An array timer, comprising:
a first capacitor configured to generate a first comparator input based on storing charge thereon using a fixed input from a supply circuit;
a first comparator configured to generate a first comparator output based on comparing the first comparator input and a reference signal from a reference block, wherein the reference signal is different from an electrical ground;
a second capacitor configured to generate a second comparator input based on storing charge thereon using the fixed input;
a second comparator configured to generate a second comparator output based on comparing the second comparator input and the reference signal; and
a reset-set memory element configured to generate an output timing signal including a rising edge and a falling edge, wherein the rising edge corresponds to the first comparator output and the falling edge corresponds to the second comparator output.

18. The array timer of claim 17, further comprising a regulator circuit configured to either charge the first capacitor based on the falling edge or charge the second capacitor based on the rising edge.

19. A method of operating a memory device including a memory array and an array timer, the method comprising:
receiving, at the array timer, a fixed input and a reference signal, wherein the fixed input is from a supply circuit and the reference signal is from a reference block;
using the array timer, generating an output timing signal based on the fixed input and the reference signal; and
controlling the memory array using the output timing signal.

20. The method of claim 19, wherein the output timing signal includes a reference activation time and a precharge time corresponding to voltage level transitions in the output timing signal.

21. The method of claim 20, wherein:
the reference activation time begins at a low-to-high transition and ends at a high-to-low transition, wherein:
the low-to-high transition is a change in voltage of the output timing signal from a low voltage level to a high voltage level, and
the high-to-low transition is a change in the voltage of the output timing signal from the high voltage level to the low voltage level; and
the precharge time begins at the high-to-low transition and ends at the low-to-high transition.

22. The method of claim 19, wherein generating the output timing signal includes:
generating a comparator input based on charging a capacitor using the fixed input;
generating a comparator output using a comparator based on comparing the comparator input with the reference signal; and
generating the output timing signal using a reset-set memory element, wherein the output timing signal is generated according to the comparator output.

23. The method of claim 22, wherein generating the output timing signal includes:
discharging the capacitor based on a transition in the output timing signal that corresponds to the comparator output;
generating a second comparator input based on charging a second capacitor using the fixed input, wherein the second comparator input is generated based on the transition;
generating a second comparator output using a second comparator based on comparing the second comparator input with the reference signal; and
transitioning voltage level of the output timing signal according to the second comparator output.

* * * * *